US008681540B2

(12) United States Patent
Zeng

(10) Patent No.: US 8,681,540 B2
(45) Date of Patent: Mar. 25, 2014

(54) TILE-LEVEL SNAPBACK DETECTION THROUGH COUPLING CAPACITOR IN A CROSS POINT ARRAY

(75) Inventor: Raymond W. Zeng, Sunnyvale, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/466,999

(22) Filed: May 8, 2012

(65) Prior Publication Data

US 2013/0051137 A1 Feb. 28, 2013

(30) Foreign Application Priority Data

Aug. 29, 2011 (WO) ................ PCT/US2011/049538

(51) Int. Cl.
*G11C 11/00* (2006.01)

(52) U.S. Cl.
USPC .............................. 365/163; 365/149; 365/148

(58) Field of Classification Search
USPC ............... 365/163, 185.33, 149, 230.08, 113, 365/185.24, 189.07, 207
See application file for complete search history.

(56) References Cited

U.S. PATENT DOCUMENTS

| | | | |
|---|---|---|---|
| 8,194,441 B2* | 6/2012 | Thiruvengadam | 365/163 |
| 8,223,535 B2* | 7/2012 | Bedeschi et al. | 365/163 |
| 2006/0221734 A1 | 10/2006 | Bedeschi et al. | |
| 2006/0227592 A1 | 10/2006 | Parkinson et al. | |
| 2007/0171705 A1 | 7/2007 | Parkinson | |
| 2008/0180990 A1* | 7/2008 | Lung | 365/163 |
| 2009/0027951 A1* | 1/2009 | Kau | 365/163 |
| 2009/0116281 A1* | 5/2009 | Parkinson et al. | 365/163 |
| 2009/0147565 A1 | 6/2009 | Lowrey | |
| 2009/0168504 A1* | 7/2009 | Lee et al. | 365/163 |
| 2009/0273968 A1* | 11/2009 | Lamorey et al. | 365/163 |
| 2010/0067285 A1* | 3/2010 | Lung et al. | 365/163 |
| 2010/0149857 A1 | 6/2010 | Tang | |
| 2010/0157666 A1* | 6/2010 | Parkinson | 365/163 |

OTHER PUBLICATIONS

International Search Report mailed Apr. 10, 2012 from International Application No. PCT/US2011/049538.
International Search Report mailed Apr. 10, 2012 in International Application No. PCT/US2011/049538.

* cited by examiner

*Primary Examiner* — Son Dinh
*Assistant Examiner* — Uyen B Tran
(74) *Attorney, Agent, or Firm* — Schwabe, Williamson & Wyatt, P.C.

(57) ABSTRACT

Embodiments of the present disclosure describe methods, apparatus, and system configurations for tile-level snapback detection through a coupling capacitor in a phase-change memory array. Other embodiments may be described and claimed.

20 Claims, 5 Drawing Sheets

TILE-LEVEL SNAPBACK DETECTION THROUGH COUPLING CAPACITOR IN A CROSS POINT ARRAY

RELATED APPLICATIONS

The present application claims priority under 35 U.S.C. §365(a) to International Application No. PCT/US2011/049538, filed Aug. 29, 2011, entitled "Tile-Level Snapback Detection Through Coupling Capacitor In A Cross Point Array", which designates the United States of America. The entire contents and disclosure of which is hereby incorporated by reference in its entirety.

FIELD

Embodiments of the present disclosure generally relate to the field of integrated circuits, and more particularly, to a tile-level snapback detection through a coupling capacitor in a cross point array.

BACKGROUND

A phase change memory and switch (PCMS) memory array is a vertically-integrated memory cell including a phase-change memory (PCM) element layered with the ovonic threshold switch (OTS). In a PCMS memory array, tile-level detection of a snapback action has been done previously using a simple logic-level gate to detect a rise action of a wordline voltage from 0 volts (V) to 1 V. Such a detection scheme effectively limits the wordline selection voltage to 0 V.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

In the following detailed description, reference is made to the accompanying drawings which form a part hereof wherein like numerals designate like parts throughout, and in which is shown by way of illustration embodiments that may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

Figure 1:
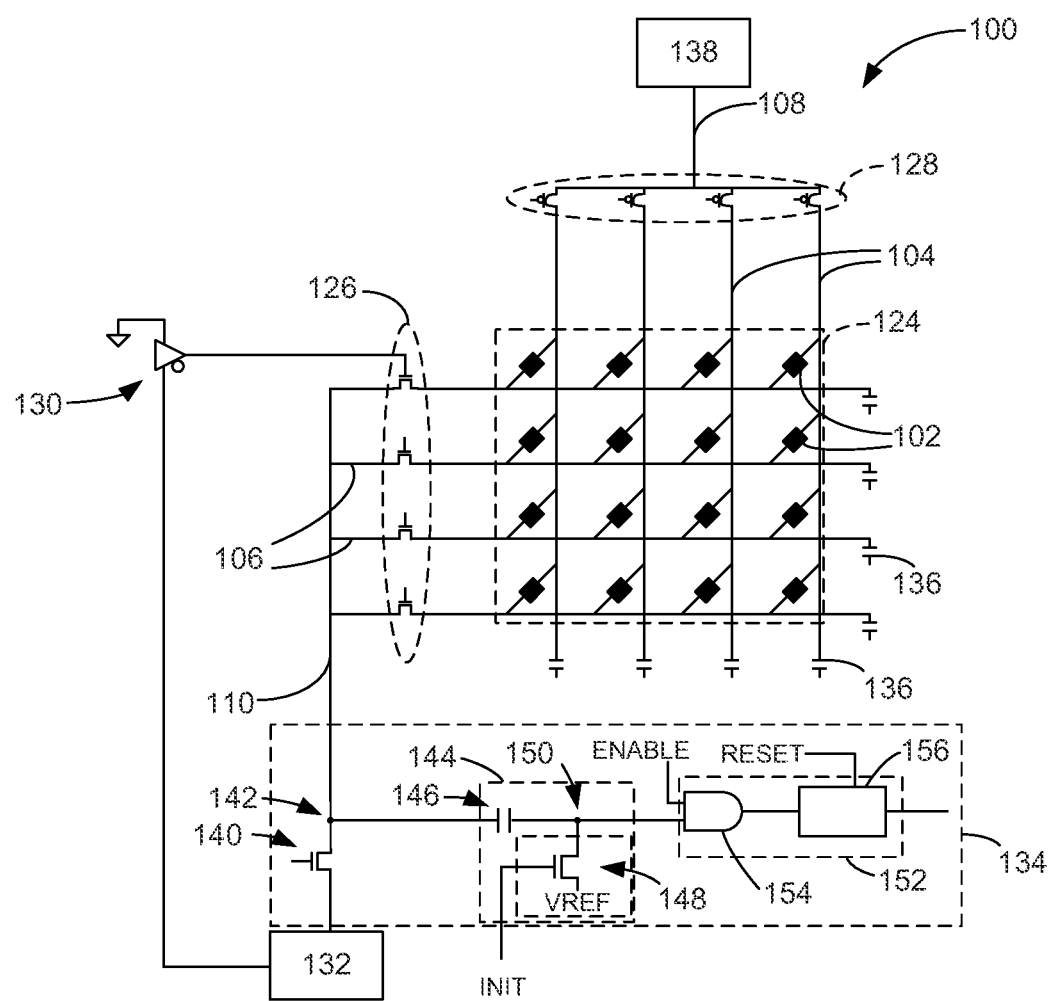
FIG. 1 illustrates a memory device in accordance with some embodiments.

FIG. 1 schematically illustrates a memory device 100 in accordance with some embodiments. The memory device 100 may include memory cells 102 configured in an array as shown. The memory cells 102 can include, for example, a phase-change material such as a chalcogenide glass that can be switched between crystalline and amorphous states with the application of heat produced by an electric current. The state (e.g., crystalline/amorphous) of a phase change material may correspond with a logical value (e.g., 1 or 0) of the memory cells 102. In such embodiments, the memory device 100 may be a phase-change memory (PCM) device.

In some embodiments, the memory device 100 may be a PCM and switch (PCMS) memory array in which the memory cells 102 include a PCM element layered with an ovonic threshold switch (OTS). Subject matter is not limited in this regard, and the memory device 100 may include other types of memory devices that benefit from the principles described herein.

The memory device 100 may further include address lines, e.g., bitlines 104 and wordlines 106, coupled with the memory cells 102, as shown. The bitlines 104 and wordlines 106 may be configured such that each of the memory cells 102 is disposed at an intersection of each individual bitline and wordline. A voltage or bias can be applied to a target memory cell using a particular wordline and bitline to select the target cell for a read or write operation. Bitline drivers 128 may be coupled with the bitlines 104 and wordline drivers 126 may be coupled with the wordlines 106 to facilitate decoding/selection of the memory cells 102, as shown. Each of the wordline drivers 126 may be coupled with a respective level shifter 130 (only one shown). The level shifter 130 may be coupled to an electrical supply, e.g., wordline supply 132, and may selectively control an associated driver to couple a wordline to a decoder 134 through a decoding path 110. Capacitors 136 may be coupled to the bitlines 104 and the wordlines 106, as shown.

The memory device 100 may include a plurality of tiles such as tile 124. The tile 124 may include a portion of the array of wordlines 106, bitlines 104, and memory cells 102 that has an associated decoder, e.g., decoder 134, and is treated as a discrete unit during a selection operation of a target memory cell. That is, in some embodiments, the tile 124 is a unit of the array that is biased to select the target memory cell in the array. Detection at a tile level facilitates concurrent reads of more than one tile per columns of tiles operating under a single controller unit. In the depicted embodiment, the tile 124 comprises an array of four wordlines and four bitlines (4 WL×4 BL); however, other tile sizes can be used in other embodiments including, for example a tile size of one thousand wordlines by one-thousand bitlines (1000 WL×1000 BL).

The bitlines 104 are coupled to a path 108 (also referred to as bitline electrode), which may be further coupled to a bitline supply 138 that provides an electrical supply for the bitlines 104. The wordlines 106 are coupled to the decoding path 110 (also referred to as a wordline electrode), which may be further coupled to the wordline supply 132 that provides an electrical supply for the wordlines 106. The paths 108 and 110 may each be a current path to the memory cells 102.

The decoder 134 may include a global selector 140 to selectively couple the decoding path 110 with the wordline supply 132; a sense node 142 that manifests a sense voltage of the decoding path 110; a conditioning circuit 144 that may be used to provide a low-voltage sense voltage that is based on the sense voltage manifested at the sense node 142; and decoding circuit 152 used to determine a set state of a selected target memory cell. As used herein, a node or line may manifest a voltage by providing, showing, or otherwise exhibiting the manifested voltage.

The sense node 142 may be a global node with respect to the tile 124. Detecting at this global node helps to reduce the number of devices needed at the tile level relative to prior designs in which tile-level sense was done on a decoded wordline path requiring additional devices between a sense node and decoding circuit.

The conditioning circuit 144 may condition the sense voltage to provide the low-voltage sense voltage in a manner to facilitate design and operation of the components of the memory device 100 such as, but not limited to, the decoding circuit 152. The conditioning circuit 144 may include a capacitor 146 coupled to the sense node 142 and an initialization circuit 148. The capacitor 146 may be coupled to, and disposed between, the sense node 142 and a sense_LV node 150 and may provide a sense_LV voltage at the sense_LV node 150 that corresponds to the sense voltage. In some embodiments, the parasitic capacitance on node 142 may be designed to be as small as possible in order to generate a snap action that can move the sense_LV through the capacitor 146. In some embodiments, the capacitor 146 may be a relatively small p-channel metal-oxide-semiconductor (pMOS) device or n-channel metal-oxide-semiconductor (nMOS) device having a capacitance of approximately 50 femtofarads (fF).

The initialization circuit 148 may be a transistor configured to initialize the sense_LV voltage at the sense_LV node 150 to an initial state. A gate of the initialization circuit 148 may be controlled by an initialization signal (INIT) received from control logic of a storage controller. The sense_LV voltage may be initialized to a reference voltage, VREF.

The decoding circuit 152 may include a logic circuit 154 having an input coupled to the sense_LV node 150 to receive the sense_LV voltage and an input coupled with control logic of a storage controller to receive an enable signal (ENABLE). The logic circuit 154 may perform a logical operation, e.g., an AND operation, on the two inputs to provide an output to a latch 156 of the decoding circuit 152. The latch 156, after being reset by a reset signal (RESET) from control logic of a storage controller, will store an output value of the logic circuit 154.

Figure 2:
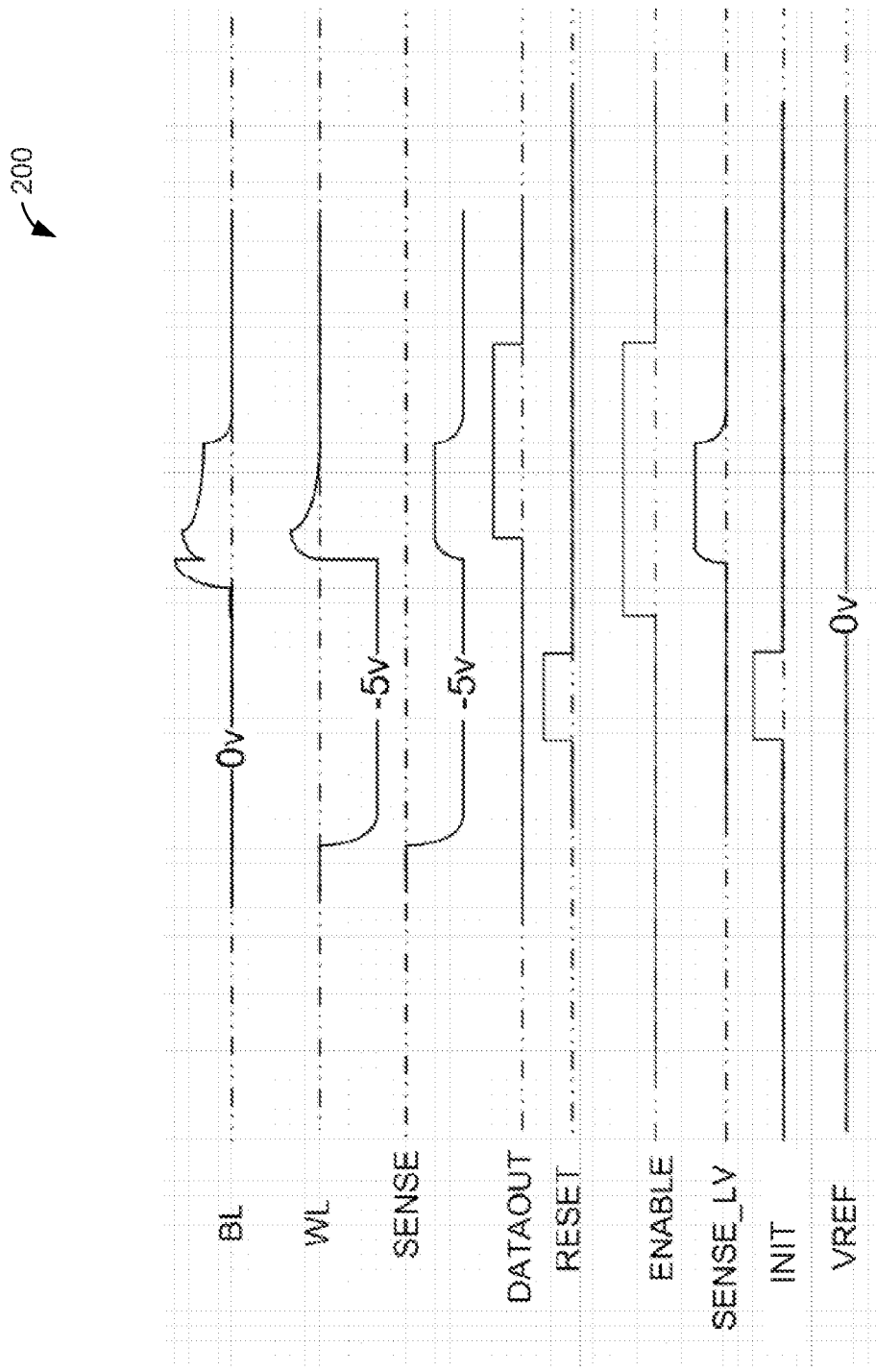
FIG. 2 illustrates timing diagrams corresponding to an access operation in accordance with some embodiments.
Figure 3:
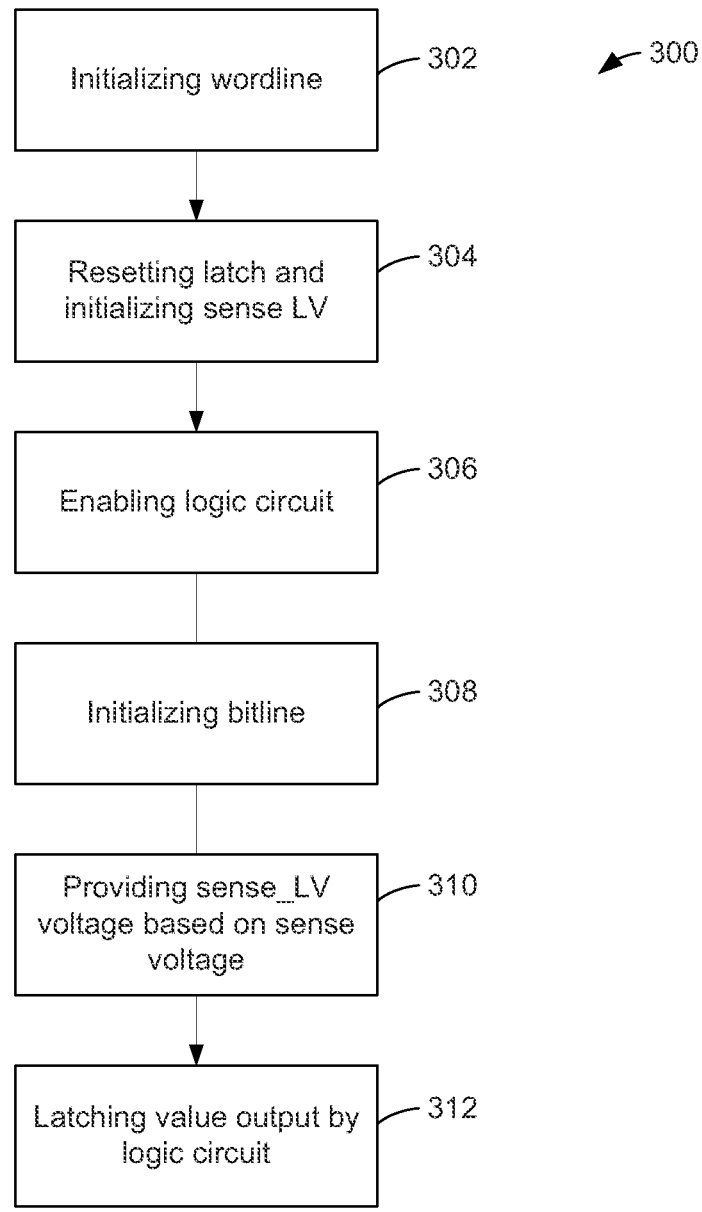
FIG. 3 illustrates a flowchart corresponding to an access operation in accordance with some embodiments.

A read operation of the memory device 100, used to determine a set state of a target memory cell, may be shown and described in additional detail, in accordance with an embodiment, by reference to timing diagrams 200 of FIG. 2 and flowchart 300 of FIG. 3.

A read operation may begin by initializing a wordline that corresponds to a target memory cell at block 302 of FIG. 3. Initializing the wordline may occur by the wordline drivers 126 selectively coupling an appropriate wordline to the decoding path 110 and the global selector 140 coupling the wordline supply 132 to the decoding path 110. This may result in a wordline voltage (WL) of the selected wordline and sense voltage (SENSE) of the sense node 142 going to the value of the wordline supply 132, e.g., −5 V, as can be seen in FIG. 2.

At block 304, the read operation may include resetting the latch 156 and initializing the sense_LV node 150. As briefly described above, control logic may drive the RESET signal to reset the latch 156 to allow for subsequent storing of a value from the logic circuit 154. Contemporaneously with the activation of the RESET signal, the control logic may also activate the INIT signal to initialize the sense_LV node 150 to an initial value, VREF, which, in this case may be ground.

At block 306, the read operation may include enabling the logic circuit 154. Enabling the logic circuit 154 may be done by the control logic activating the enable signal that is provided to one of the inputs of the logic circuit 154.

At block 308, the read operation may include initializing a bitline that corresponds to the target memory cell. Initializing the bitline may occur by the bitline drivers 128 selectively coupling an appropriate bitline to the bitline supply 138 through the path 108. This may result in the bitline voltage (BL) going to a value of the bitline supply 138, e.g., 5 V.

If the target memory cell has a set state, the voltage of the target memory cell will cross a threshold voltage, after the initialization of the bitline, at which point the voltage of the target memory cell will snapback down to its holding voltage. Both bitline and wordline voltages will collapse down toward the middle, or to the side that has a more capacitive load (in this case, the bitline side is designed with a larger capacitive load). The sense voltage at the sense node 142 may then step up from −5 V to a lesser negative voltage.

At block 310, the read operation may include providing the sense_LV voltage based on the sense voltage. The conditioning circuit 144, and the capacitor 146, in particular, may provide the sense_LV voltage in a manner such that a change in the sense voltage results in a corresponding change in the sense_LV voltage. Thus, the step-up voltage action exhibited by the sense voltage may also be exhibited by the sense_LV voltage. However, while the sense voltage may be negative, even after the step-up voltage action, the sense_LV voltage may step up from an initial VREF value, e.g., ground, to a value sufficient to trip the logic circuit 154.

At block 312, the read operation may include latching a value output by the logic circuit 154. With both the enable signal and sense_LV signal being high, the logic circuit 154 may output a value (DATAOUT) that is also high. This high-value may be stored in the latch 156 to indicate a set state of the target memory cell.

While the above embodiment describes the initial value, VREF, of sense_LV voltage as ground, the initial value of the sense_LV voltage may vary in various embodiments and may depend on particular configuration of the decoding circuit 152, the voltage swing associated with a snapback condition, and/or an offset of the sense voltage due to cell leakage for different data patterns at the selection time before a snapback action. For example, due to potential movements by way of leakages of a fully set array, the sense node 142 may move slightly when reading a reset bit (no snapback action). In such instances, the sense_LV voltage, if not initialized to proper level, may cross the trip point of the logic circuit 154 and cause a false detection. Thus, careful placement of VREF voltage may facilitate correct detection of set versus a reset memory cell.

Figure 4:
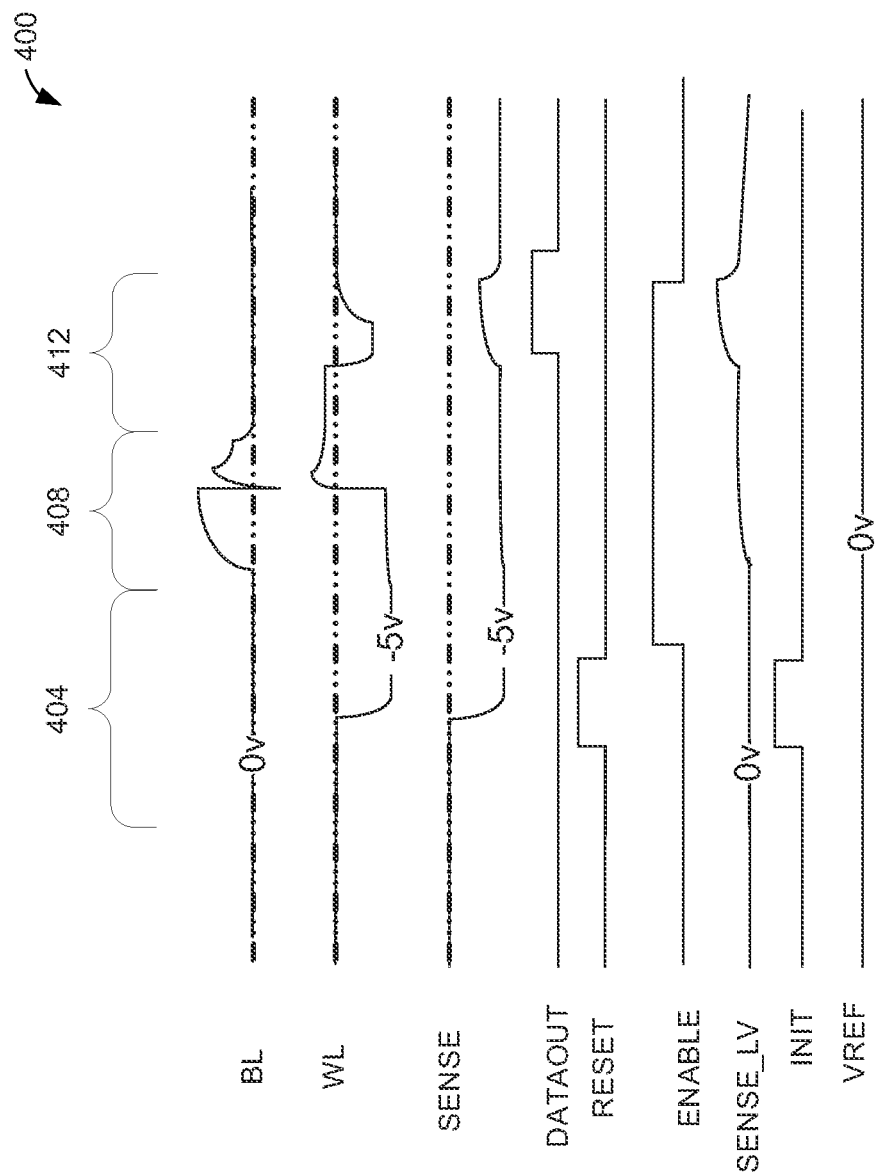
FIG. 4 illustrates timing diagrams corresponding to an access operation in accordance with some embodiments.

While the above description describes detecting a snapback condition as it occurs, in other embodiments, it may be desirable for the target memory cell to be isolated from the sense node 142 during a snapback event in order to avoid the decoding path 110 electrically interfering with the snapback event. FIG. 4 provides timing diagrams illustrating an operation of such an embodiment. In period 404, the memory device 100 may be initialized in a manner similar to that described above with respect to FIG. 2. In period 408, the target memory cell may experience a snapback event. In this embodiment, the sense node 142 may be disconnected from the wordline during the snapback event, thus, the sense voltage does not change. In period 412, the sense node 142 may be reconnected to the wordline and a charge may be shared between the wordline and the sense node 142. The logic circuit 154 may sense this charge sharing, as manifested through the sense_LV and output a high DATAOUT value indicating set state of the target memory cell.

Conditioning of the sense signal by the conditioning circuit 144, as shown, facilitates the design and operation of the components of the memory device 100 by providing a system in which the selection voltages of the wordline and bitline can be arbitrary, −5 V and 5 V, respectively, in the described embodiment. Systems requiring direct detection of the sense voltage, on the other hand, are effectively limited to non-negative selection voltages of the wordline given that logic gates operate from 0 V to Vcc.

Figure 5:
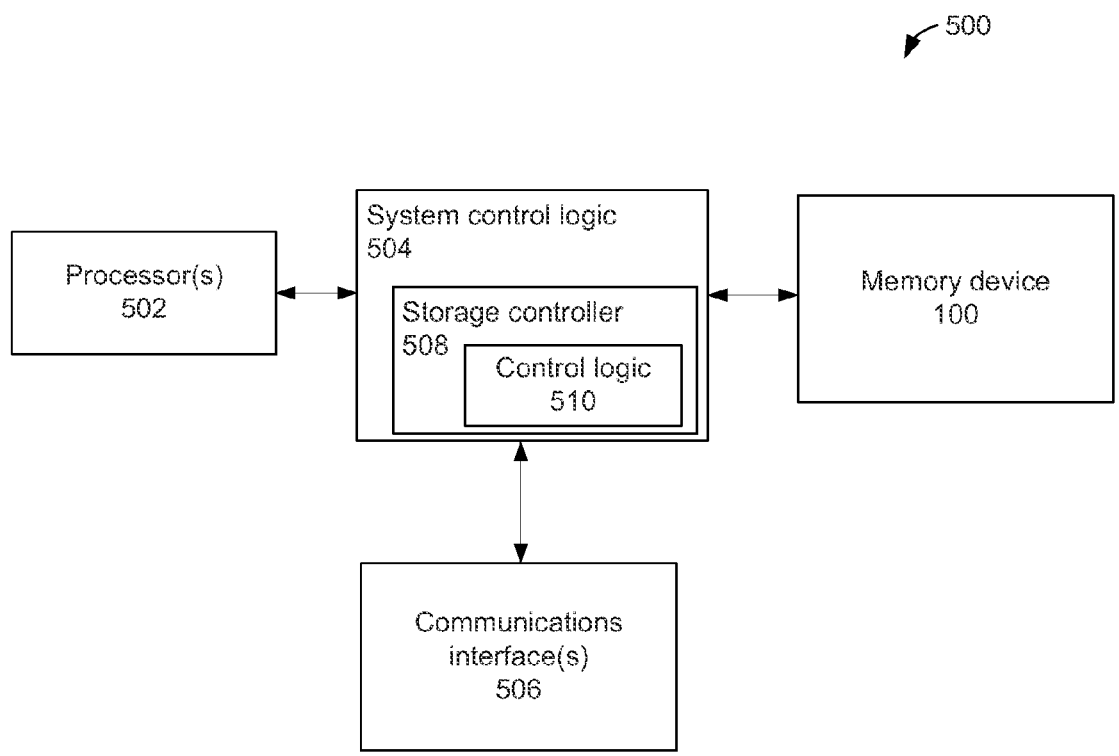
FIG. 5 illustrates an example system in accordance with some embodiments.

The memory device described herein may be implemented into a system using any suitable hardware and/or software to configure as desired. FIG. 5 illustrates, for one embodiment, an example system 500 comprising one or more processor(s) 502, system control logic 504 coupled to at least one of the processor(s) 502, the memory device 100 coupled to system control logic 504, and one or more communications interface(s) 506 coupled to system control logic 504.

Communications interface(s) 506 may provide an interface for system 500 to communicate over one or more network(s) and/or with any other suitable device. Communications interface(s) 506 may include any suitable hardware and/or firmware. Communications interface(s) 506 for one embodiment may include, for example, a network adapter, a wireless network adapter, a telephone modem, and/or a wireless modem. For wireless communications, communications interface(s) 506 for one embodiment may use one or more antennae.

For one embodiment, at least one of the processor(s) 502 may be packaged together with logic for one or more controller(s) of system control logic 504. For one embodiment, at least one of the processor(s) 502 may be packaged together with logic for one or more controllers of system control logic 504 to form a System in Package (SiP). For one embodiment, at least one of the processor(s) 502 may be integrated on the same die with logic for one or more controller(s) of system control logic 504. For one embodiment, at least one of the processor(s) 502 may be integrated on the same die with logic for one or more controller(s) of system control logic 504 to form a System on Chip (SoC).

System control logic 504 for one embodiment may include any suitable interface controllers to provide for any suitable interface to at least one of the processor(s) 502 and/or to any suitable device or component in communication with system control logic 504.

System control logic 504 for one embodiment may include a storage controller 508 to provide an interface to the memory device 100 to control various access operations such as, but not limited to, set, reset, and read operations. The storage controller 408 may include control logic 410 that is specifically configured to control the memory device 100 by generation and issuance of enable, initialization, and reset signals as discussed above. The control logic 410 may further generate various selection signals to control drivers, level shifters, global selectors, etc. In various embodiments, the control logic 410 may be instructions stored in a non-transitory computer readable medium that, when executed by at least one of the processor(s) 502 cause the storage controller to perform the above-described operations.

In various embodiments, the system 500 may be a desktop computing device, a laptop computing device, a mobile computing device (e.g., a smartphone, a tablet, etc.). The system 500 may have more or less components, and/or different architectures.

Although certain embodiments have been illustrated and described herein for purposes of description, a wide variety of alternate and/or equivalent embodiments or implementations calculated to achieve the same purposes may be substituted for the embodiments shown and described without departing from the scope of the present disclosure. This application is intended to cover any adaptations or variations of the embodiments discussed herein. Therefore, it is manifestly intended that embodiments described herein be limited only by the claims and the equivalents thereof.

What is claimed is:

1. An apparatus comprising:
   a phase-change memory array having a tile that includes a plurality of memory cells; and
   a decoder including:
   a decoding path having a sense node configured to manifest a first voltage;
   a capacitor coupled with the sense node at a first terminal and configured to provide a second voltage based on the first voltage; and
   a logic circuit coupled with the capacitor at a second terminal and configured to control a latch based on a received enable signal and the second voltage.

2. The apparatus of claim 1, wherein the apparatus comprises a phase-change memory and switch (PCMS) device.

3. The apparatus of claim 1, wherein the capacitor is coupled to the sense node such that a change in the first voltage results in a corresponding change in the second voltage, wherein the first and second voltages have different values.

4. The apparatus of claim 1, wherein the decoder further includes an initialization circuit coupled to the capacitor and configured to set the second voltage at an initial state prior to a detection of a snapback event.

5. The apparatus of claim 4, wherein the initial state is ground.

6. The apparatus of claim 1, wherein the logic circuit is configured to control the latch based on a result of an AND operation of the second voltage and the enable signal.

7. The apparatus of claim 1, wherein the first voltage is a negative value before and after a snapback event.

8. The apparatus of claim 1, wherein the capacitor has a capacitance of approximately 50 femtofarads.

9. A system comprising:
   a phase-change memory (PCM) device including a decoder having:
   a conditioning circuit configured to provide a non-negative sense voltage at a first node based on a negative sense voltage at a second node; and
   a logic circuit configured to detect a snapback action based on the non-negative sense voltage and an enable signal; and
   a storage controller coupled with the PCM device and configured to provide the enable signal wherein the conditioning circuit includes a capacitor coupled with the second node at a first terminal, and with the logic circuit at a second terminal.

10. The system of claim 9, further comprising:
a decoding path having the second node to manifest the negative sense voltage.

11. The system of claim 10, wherein the conditioning circuit includes a capacitor coupled to the first and second nodes and configured to provide the non-negative sense voltage to a first input of the logic circuit.

12. The system of claim 11, wherein the conditioning circuit further comprises:
an initialization circuit configured to:
receive an initialization signal from the storage controller; and
set the non-negative voltage to an initial state based on the initialization signal.

13. The system of claim 9, wherein the PCM device comprises a plurality of tiles and a plurality of decoders that respectively correspond to the plurality of tiles.

14. The system of claim 9, wherein the system comprises a laptop computing device or a mobile computing device.

15. A method of detecting a snapback condition comprising:
selecting a memory cell of a tile by selectively driving a bitline and wordline with first and second voltages, respectively;
providing an enable signal to a logic circuit of a decoder of the tile;
providing a first positive sense voltage to the logic circuit based on a second negative sense voltage that is manifest at a sense node of a decoding path, wherein a change in the second sense voltage results in a corresponding change in the first sense voltage; and
latching a value output by the logic circuit.

16. The method of claim 15, further comprising:
initializing the first voltage to a first state prior to said providing of the enable signal.

17. The method of claim 16, wherein the first state is ground.

18. The method of claim 15, wherein the second sense voltage is negative before and after a snapback event that occurs as a result of the selecting of the memory cell.

19. The method of claim 15, further comprising:
providing the first sense voltage with a capacitor coupled with the sense node.

20. The method of claim 15, further comprising:
disconnecting a decoder from the selected wordline prior to the selecting of the memory cell;
reconnecting the decoder to the selected wordline after a snapback event occurs, wherein the snapback event occurs as a result of the selecting of the memory cell; and
determining a set state of the memory cell based on the latched value.

* * * * *